United States Patent
Aras

(10) Patent No.: US 11,620,466 B2
(45) Date of Patent: Apr. 4, 2023

(54) MULTI-AXIS POSITION SENSING SYSTEM

(71) Applicant: Richard Aras, Valldemossa (ES)

(72) Inventor: Richard Aras, Valldemossa (ES)

(73) Assignee: ANEMOS TECHNOLOGY LIMITED, London (GB)

( * ) Notice: Subject to any disclaimer, the term of this patent is extended or adjusted under 35 U.S.C. 154(b) by 46 days.

(21) Appl. No.: 17/266,034

(22) PCT Filed: Aug. 2, 2019

(86) PCT No.: PCT/IB2019/056607
§ 371 (c)(1),
(2) Date: Feb. 4, 2021

(87) PCT Pub. No.: WO2020/031041
PCT Pub. Date: Feb. 13, 2020

(65) Prior Publication Data
US 2021/0383085 A1 Dec. 9, 2021

(30) Foreign Application Priority Data

Aug. 6, 2018 (GB) ...................................... 1812784

(51) Int. Cl.
*G06K 7/10* (2006.01)
*G06T 7/73* (2017.01)
(Continued)

(52) U.S. Cl.
CPC ......... *G06K 7/10722* (2013.01); *G06F 3/005* (2013.01); *G06K 7/1417* (2013.01); *G06T 7/73* (2017.01)

(58) Field of Classification Search
CPC ....... G06F 3/005; G06T 7/73; G06K 7/10722; G06K 7/1417
See application file for complete search history.

(56) References Cited

U.S. PATENT DOCUMENTS

2006/0215913 A1  9/2006  Wang et al.
2010/0086236 A1*  4/2010  Lapstun ............... G06K 7/1417
                                                    382/317

FOREIGN PATENT DOCUMENTS

CN  107492096 A  12/2017
EP  0254644 A2  1/1988

OTHER PUBLICATIONS

Bruckstein et al., "Simple and Robust Binary Self-Location Patterns", IEEE Transactions on Information Theory, IEEE Press, USA,(Jul. 2012), vol. 58, No. 7, doi: 10.1109/TIT.2012.2191699, ISSN 0018-9448, pp. 4884-4889, XP011447056.

* cited by examiner

*Primary Examiner* — Laura A Gudorf
(74) *Attorney, Agent, or Firm* — Lelkes IP; Robert Lelkes

(57) ABSTRACT

Multi-axis self-location method and apparatus wherein de Bruijn sequences on 2 or more axes are convolved into an array of symbols such as halftone dots to form a reference scale. The position of an imaging device such as a camera relative to the reference scale is ascertained from the captured camera image by bit-wise reconstitution of axis position codes with simple, predominantly linear operations over small neighbourhoods. Judicious choice of differential coding, LFSR generator polynomials, mathematical operators, and deconvolution kernels enables code digits of an axis to be regenerated while simultaneously cancelling out the contributions of other axes. Also optionally provided are uniform DC-balanced variants yielding greatly improved position interpolation, isometric implementations decodable from high-aspect-ratio sample windows, robust concatenated error correction, and extensions into n-space.

20 Claims, 10 Drawing Sheets

(51) Int. Cl.
*G06F 3/00* (2006.01)
*G06K 7/14* (2006.01)

MULTI-AXIS POSITION SENSING SYSTEM

FIELD OF THE INVENTION

The present invention relates to optical position sensors that determine sensor location by means of imaging and deciphering a section of a coded reference scale.

BACKGROUND OF THE INVENTION

Optical position sensors principally considered here consist of two parts: a specially patterned, planar reference scale and a sensor or "readhead" that moves across the scale with three degrees of freedom in x, y, and at any angle. The sensor, an imager or camera and attached image-processing unit, can recognise its location on the plane by decoding a small fraction of the code patterned on the scale. Commonly known as "self-location", the objective is a high accuracy (nanometre), multi-axis linear and rotational output measurement represented by a total of perhaps 100 bits.

Self-location coding schemes have been studied by mathematicians for decades and the two-dimensional, 4-orientable patterns found (decipherable on the plane under any rotation) are complex to encode and decode and do not address other important system criteria. The mathematically marvellous de Bruijn Tori are computationally heavy to decipher—exponentially so under rotation or in the presence of noise—to the extent that this has been christened the "De Bruijn Torus Problem". Well known in the art are 1D sensors using Linear Feedback Shift Register (LFSR) code sequences (subsets of de Bruijn sequences) where a sliding window generally of a size equal to LFSR polynomial order yields codewords that uniquely identify every position. However, extending simple and effective Gray Codes or de Bruijn Sequences beyond 1D has proven elusive. In practice, industry still relies on 1D sensors.

Multi-axis machines, such as CNC mills, use one position sensor on each axis of motion or stage. A large range of technologies exists for this kind of linear or rotary (single-axis) measurement. However, as each axis measurement is subject to orthogonality and Abbe errors plus mechanical play relative to other connected stages, mitigation entails immensely stiff support frames, carriages, and high-precision ways and bearings. The result is massive, slow, expensive machines where moving heavy parts requires larger motors consuming more power. Embodied energy in both end products and in the multi-ton machine tools themselves has both economic and ecological impact—and increasingly so with the proliferation of 3D print-on-demand and distributed manufacturing.

At the other end of the spectrum, 3D printers and other low-cost machinery commonly use open-loop stepper-motor drives that waste significant power to avoid "slipping" or undetectable location loss resulting in ruined print runs. Servo control incorporating capable, low-cost position sensors could save power, time, and money, whilst increasing accuracy and speed. As with their bigger machine-tool cousins, 3D printers could benefit from multi-axis sensing in ways beyond just downsizing, saving power, and error detection/compensation. "Multidimensional" translates to more degrees of freedom and as such enables designs with radically different kinematic constraints, cost trade-offs, and benefits. Economical position sensors that, for instance, measure motor bearing wear or spindle run out as well as shaft angle are tantalisingly palpable if suitable sensing systems can be developed.

At the priority date of this application, CMOS image sensors cost less than a pound of steel or limit-switches; computers can be bought for the price of a hand drill. Commodity megapixel cameras supply a million times more information per frame than needed in the final position result. From a system perspective, then, any academic fixation on maximally efficient coding (lowest number of discrete symbols to represent digital position) has become specious. Using more camera pixels and processing more symbols is in fact highly advantageous: more information improves interpolation accuracy in the non-integer, sub-discrete realm and the 1D position sensors of today commonly use this technique. Most importantly, perhaps, better interpolation reduces scale costs. Large area, 2D scale manufacturing will dominate system costs which increase exponentially when printed with higher resolution features, greys or multiple colours. Lithography of black-and-white 100 µm-pitch features over spans of metres is eminently practical, nanometre features is not. Interpolating 100 µm grids to nanometre-range resolution is perfectly feasible, but requires processing many thousands of symbols and pixels to achieve. Therefore, integer and fractional position information are indispensable, and a practical code patterns must be designed for both but with an emphasis on interpolation. The integer portion of a position measurement might be 16 bits (6 metre range for 100 µm-pitch grid features) and is an exact number. The resolution of the fractional portion, an inexact quantity derived from transcendental functions, can be 16 or more significant binary digits. Subsequently in this document these two constituent coordinates parts shall be referred to as integer part and interpolated or fractional part.

Other important coding design criteria follow from previous observations. The row-serial, column-parallel nature of common image sensor arrays dictates that one dimension of the sampled image is processed serially thus typically limiting position updates to a 60 Hz frame rate. To circumvent this limitation for kilohertz-bandwidth servo positioning systems, it is desirable to capture wide images (many column pixels) with as few rows as possible. In other words, to be able to decode images with a high aspect ratio and ideally with features sampled close to the Nyquist limit (fitting codes in as few rows as possible, minimise pixels per symbol, and optical magnification).

It will be understood that the image capture process is quasi-continuous, greyscale or analogue sampling in the presence noise and with errors due to occlusion, detritus, and so on. Reliable decoding and error correction (using data redundancy) under these conditions is vital. However, error detection, signal quality assessment, and graceful failure are all important—safety critical on heavy machinery.

Given the large data inflation behind accurate interpolation and reliability, computational efficiency and algorithmic complexity can become significant cost factors in high-speed operation. Therefore, a further objective is to use simple, linear processes well suited to modern CPUs, GPUs, and pipelined vector-processing hardware as opposed to the bit manipulation, decision trees, search algorithms, feature extraction, and so forth frequently found in discrete mathematics and classic image recognition algorithms.

Summarising the problems with the prior art: it would be desirable to provide a self-location system which is capable of reliably, efficiently transforming highly-redundant gigabits-per-second video streams to kilobit-per-second results, which predominantly uses linear procedures, high resolution interpolation, while utilising economically manufactured scales and high-aspect-ratio, low-magnification cameras.

STATEMENT OF INVENTION

The present invention solves the aforementioned problems by the features of the independent claims. Preferred beneficial embodiments thereof are defined by the features of the dependent claims.

SUMMARY OF INVENTION

According to a first aspect of the present invention, a method for multi-axis position sensing is provided, wherein the method comprises the steps of capturing, by means of an imaging device, a partial image of a reference scale. The reference scale comprises a grid pattern comprising a plurality of discrete symbols at axis intersections of a plurality of axes in discrete space, wherein the plurality of discrete symbols represent a combination of axis digits from position codes on each axis of the plurality of axes defined by a combination function (a mathematical operator applied to intersecting symbols or groups of intersecting symbols), such that axis data can be reconstituted from small groups of the plurality of discrete symbols, wherein preferably two symbols are used to recover one axis digit, which is smaller than the order of the plurality of position codes. Further, a processing means is configured to several method steps in order to derive a position of the imaging device in relation to the reference scale. The method steps include performing a resampling transform of the captured image to yield an array with one discrete symbol per entry; applying kernels to the array to separate and extract axis digits; assembling the extracted axis digits into a plurality of vectors; and decoding the plurality of vectors to determine a value for integer-value alignment of the imaging device to the reference scale for each axis.

The reference scale of the present invention may be at an arbitrary x-y offset and angle and effectively acts as a metrology reference—like a 2D ruler—with special characteristics that beneficially enable reading the reference scale with very precise interpolation. Although interpolation per se may be considered a standard technique, the nature of the reference scale coding according to the present invention is completely novel over the prior art due to the use of, for example: differential coding, a multilevel halftone grid, and linear summation of axes. Practical 3D scale formulations are, to the knowledge of the applicant, unknown in the prior art. According to the present invention, the reference scale is captured by an imaging device such as a camera in order to produce an input image. Preferably, camera video capture is performed due to its versatility i.e. it is useful across a wide range from standard "square-like" pixel arrays to special wide and short, high-aspect ratio, views which advantageously enable very high frame/sample rates. Standard techniques of image capture are known to the skilled person, however the present invention preferably implements certain forms thereof in order to achieve high-aspect-ratio sampling. According to the present invention, preferably, 2D Fourier analysis is applied to the captured image in order to finds peaks in the spectrum corresponding to the dominant dot-grid frequency which provide both angle and phase (interpolation) information to guide affine transformation and image resampling. Such Fourier or similar techniques enable determination of the alignment of the dot grid relative the sampling/pixel grid. Although the use of spectral analysis for registration and realignment may be familiar to the skilled person in 1D and possibly 2D position sensing contexts, the reference scale of the present invention has unique properties such as, for example, halftone representation so that dots (spectral data) are always present and uniform DC balancing so that it may this almost certainly true in 2D and above applications. According to the present invention, image resampling and alignment is preferably performed by affine transformation. With the alignment data determined from the aforementioned analysis step, the sample picture is transformed to a pixel-per-dot image with shift (phase and fraction part), rotate and scale (affine) transformation and spatial filtering. According to the invention, the realigned pattern is preferably processed with appropriate kernels to extract an LFSR sequence vector for each dimension. The pixel-per-dot image is preferably convolved with the corresponding kernel to produce the LFSR bit vector of the digital part for x and y axes. The present invention thereby provides novel scale coding and linear processing in particular. The vectors are decoded to identify each axis, the discrete coordinate therefor, and the quadrant of rotation to which fractional parts are added to give the final result. Preferably, the vectors comprise LFSR bit vectors which are decoded back to standard, counting binary form and fraction parts added, and error detection/correction is applied using the redundancy of the input vectors. The present invention thereby enables efficient decoding and identification of axes by means of, for example, reversible, sub-maximal length codes sharing same LFSR polynomial, by using mechanical constraints (e.g. velocity) to reduce search space, hardware complexity, processing latency, and by hamming distance calculation and/or linear correlation to find maximum likelihood results and error margin (difference between best/correct result and others).

In a preferred embodiment of the first aspect of the invention, the plurality of discrete symbols comprise at least one of halftone dots in 2D, spheres, blocks, and hyperspheres in higher dimensional lattices, and wherein a value for the plurality of discrete symbols is represented by area or volume.

In a further preferred embodiment of the first aspect, the combination function at the axis digit intersections is modulo or linear addition.

In another preferred embodiment of the first aspect, the position code for each axis is a differentially-coded de Bruijn sequence or preferably an LFSR sequence that is self-dual under differential coding.

In yet another preferred embodiment of the first aspect, the axis combination function is linear addition, and wherein kernel calculations are extended to accumulate linear sums over a plurality of digit decode opportunities thus maintaining intermediate vector results in the linear, rather than discrete, processing domain for subsequent processing.

In a further preferred embodiment of the first aspect, a spectral analysis of the captured image, preferably by FFT or a pruned FFT in the electronic and/or optical domain, is used to extract a plurality of fractional alignment parameters of the imaging device relative to the grid pattern. The method according to this preferred embodiment further comprises the steps of using the determined alignment values to resample the captured image into the array with one discrete symbol per entry, and extracting a plurality of angular and fractional positions for subsequent concatenation with their corresponding integer position alignments based on the decoded vectors.

In another preferred embodiment of the first aspect, the method further comprises estimating the axes of further degrees of freedom between the imaging device and the reference scale according to perspective analysis of the captured image and calibration of mechanical characteristics of the imaging device such as optical path lengths, lens focal length, or other dimensional factors using enhanced spectral analysis.

In yet another preferred embodiment of the first aspect, the resampling uses pixel mapping based on a frequency-domain derived transform with inclusion only of values of valid pixels wherein the kernel of each symbol group is fully represented in the captured image without clipping at the captured image edges.

In a further preferred embodiment of the first aspect, static, dynamic, inter-frame, and/or intra-frame information, constraints and heuristics are used to reduce position vector decode complexity and/or increase reliability.

In another preferred embodiment of the first aspect, imaging resolution is switched to trade-off sampling speed and positional accuracy (e.g. continuous servo motion and instantaneous metrology.)

In yet another preferred embodiment of the first aspect, the grid pattern is configured such that, when decoded by a processing means, the grid pattern is useable to compensate for systematic interpolation errors introduced by pattern-related bias, and/or bias caused by known errors detected in the decode process.

According to a second aspect of the present invention, a position sensing system is provided which comprises an imaging device and processing means. The position sensing system is configured to perform the method steps of the aforementioned first aspect of the invention or any one or combination of the preferred embodiments thereof.

In a preferred embodiment of the first and second aspects of the invention, the imaging device comprises at least one of an optical camera, electrostatic, micromechanical, X-ray, nuclear magnetic resonance, magnetic sensor or other imaging means.

In a further preferred embodiment of the first and second aspects of the invention, the imaging device further comprises multiple sensors and/or the reference scale further comprises multiple scales systems configured to resolve a full 6-axis position of the imaging device or the higher dimensionality of a moving or flexing target object relative to the imaging device.

In another preferred embodiment of the first and second aspects of the invention, the grid pattern is configured to act as both the reference scale and a motor element such as the stator grid of a Sawyer motor, inch-worm drive, or motion actuator system, and/or wherein the image device is further configured to act as motion actuator, which can preferably be used in fiducial marking and/or micro-mechanical alignment of silicon wafers.

According to a third aspect of the present invention, a position coding system for multi-axis position sensing by an imaging device is provided. The position coding system comprises a reference scale comprising a grid pattern comprising a plurality of discrete symbols at axis intersections of a plurality of axes in discrete space, wherein the plurality of discrete symbols represent a combination of axis digits from a plurality of position codes on each axis of the plurality of axes defined by a combination function, such that axis data can be reconstituted from small groups of the plurality of discrete symbols, wherein preferably two symbols are used to recover one digit, which is smaller than an order of the plurality of position codes.

In a preferred embodiment of all aspects of the invention, a modulation is applied that inverts up to half of the position code values to achieve a uniform DC-balanced reference scale.

In a further preferred embodiment of all aspects of the invention, the plurality of discrete symbols comprises axis sequences which are selected for the grid pattern such that every position codeword value used is unique in sequence codeword values of all axes and may be used to unambiguously identify both axis and position when processed by a processing means.

In another preferred embodiment of all aspects of the invention, axis sequences are chosen such that every position codeword value used and its bit-reversed value is unique within sequence codeword values of all axes and thus unambiguously identifies axis, position, and quadrant under any rotation or reflection.

In yet another preferred embodiment of all aspects of the invention the reference scale further comprises redundant information useable for error detection and correction by means including at least one of averaging, majority voting, correlation functions, minimum Hamming distance calculation, maximum likelihood, and concatenated error correction.

In a further preferred embodiment of all aspects of the invention, the grid pattern includes an extra or redundant code axis which enables an any-angle, high-aspect-ratio imaging scale pattern decoding, wherein the extra or redundant code axis preferably comprises an isometric arrangement of three axes in 2D, or additional diagonal axes in 2D and higher dimensions.

In another preferred embodiment of all aspects of the invention, the reference scale makes use of portions and/or detectable variations of the plurality of discrete symbols for additional non-position location information such as scale dimensions, ancillary product information, sub-coding, cryptographic, or other data.

In yet another preferred embodiment of all aspects of the invention, the reference scale is formed by shaping, printing, lithography, display, projection, holographic, or other means on a planar surface, planar surface with polar coordinate arrangement, curved surface such as cylinder or sphere, and optionally where cyclic codes are used to seamlessly wrap around the scale on one or more axes.

According to a fourth aspect of the invention, an apparatus is provided for manufacturing the position coding scheme according to the third aspect of the invention, or any preferred embodiments thereof. In order to do so, the apparatus is configured to perform the method steps of generating a code sequence for each axis; combining intersecting axis code digits of the code sequence to determine a combined value for each axis; generating a symbol to represent the determined combined value; and reproducing the symbol in its predetermined location. The grid pattern of the reference scale is pre-calculated, calculated in subsections, or preferably rasterised on-the-fly by a tangible computing means including CPU, GPU, hardware, or other processing means.

According to a fifth aspect of the invention, a computer-implemented storage medium is provided which comprises instructions i.e. software or firmware stored thereupon which, when executed by a computer, cause the computer to perform the method steps according to the first aspect of the invention any preferred embodiment thereof.

According to a sixth aspect of the invention, a computer-implemented storage medium is provided which comprises instructions i.e. software or firmware stored thereupon which, when executed by a computer, cause an apparatus to manufacture the position coding scheme according to the third aspect of the invention or any preferred embodiment thereof. The computer causes the apparatus to perform the method steps of generating a code sequence for each axis; combining intersecting axis code digits of the code sequence to determine a combined value for each axis; generating a symbol to represent the determined combined value; and reproducing the symbol in a predetermined location. The grid pattern of the reference scale is pre-calculated, calculated in subsections, or preferably rasterised on-the-fly by a tangible computing means including CPU, GPU, hardware, or other processing means.

The contributions to the art by the present invention include the following:

Bit-wise axis separability using simple, differentially-decoded kernel operations.

Linear-sum symbol combination enabling predominantly linear pipeline processing.

Simple 4-orientable codes using reversible, multi-axis LFSR codes sharing the same polynomial generator and decode logic.

DC balanced patterns for very high accuracy interpolation.

High-aspect-ratio sensor configurations for high-speed sensing on both isometric and rectangular grids.

Use of static system conditions, intra- and inter-sample constraints to decimate computation and reduce latency.

High-speed sequence decoding using discrete or analogue domain correlation against small, machine-dynamics-constrained search space.

Extension into higher dimensions.

The present invention in its simplest form uses differential coding to build two or more axes of polarity- and DC offset-insensitive sequences combined at orthogonal intersections with modulo or linear addition. The resulting grid is represented on the scale by symbols such as halftone dots and decoding in the simplest embodiment is a process of differentiation and discrimination along the axis of interest, i.e. calculate adjacent symbol differences and threshold absolute values. An exemplary embodiment of the invention makes use of LFSR sequences that are their differentially-coded dual and thus naturally incorporate parity checks that can mitigate error multiplication of differential coding. It will be noted, however, that any sequence type could be differentially coded and combined, including but not limited to natural binary with word delimiters, de Bruijn, or sigma-delta modulation, and are as such considered within the scope of the present invention. In further preferred embodiments of the invention, these LFSR examples are augmented for 4-orientability, enhanced interpolation, and extension into higher dimensions.

For brevity and clarity in distinguishing fractional or real numbers from fundamentally integer numbers, the term "analogue" as used henceforward describes any signal, including those in the digital domain (e.g. digitised video), that does not represent a discrete, or number field value. "Digital" refers to inherently integer or discrete number field values. Also, the term "codeword" refers to a plurality of bits or a digital word value of sufficient size to represent digital position on an axis. Typically, codeword size is equal or larger than the logarithm of code sequence length, or LFSR polynomial order, but in constrained contexts it can smaller. Conceptually then, codewords are small sub-sequences or sliding-windows onto a long code sequence. "Vector" is a one-dimensional array of usually of codeword-size or greater, and henceforth refers specifically to raw axis data extracted for each dimension in a multidimensional position sensor prior to digital decode.

According to an exemplary embodiment, an LFSR sequence is chosen such that deconvolution or reconstitution of each of the individual code digits or bits of each axis requires only simple mathematical operations over small neighbourhoods, a "kernel", of symbols. Relying on the principle that the LFSR digit of one axis can be regenerated from kernel data while simultaneously cancelling out contributions of all other convolved axes (convolved in a broader sense than the strict mathematical). To assemble the full codewords that indicate location, kernel operators are stepped over the sampled image grid. These criteria are a generalisation of multi-axis, 2-bit differential coding and combining, and provide any number of possible implementations in other number bases, in higher dimensions, LFSR generator polynomials, convolution operator type, and so on. Therefore, this aspect of the present invention is first elucidated by the following straightforward 2D planar example in the binary Galois field.

An order-22 LFSR x-axis sequence, wherein each bit value is derived from two other adjacent bit positions, $Lx_{n+22}=Lx_n \oplus Lx_{n+1}$ ($\oplus$ denoting modulo-2 sum, XOR) is convolved by an orthogonal y-axis sequence, to construct an x-y grid on rows and columns where the value of each grid position is $Lx_x \oplus Ly_y$. A kernel of two adjacent bit symbols along the x-axis summed modulo-2 reproduces one bit of the x-axis sequence 22-bits away, while cancelling out y-values that repeat in both positions:

$$Lx_{n+22}=Lx_n \oplus Ly_p \oplus Lx_{n+1} \oplus Ly_p \text{ since: } Ly_p \oplus Ly_p = 0$$

Hence, a shifted 22-bit codeword is reconstituted from 23, 2-value symbols by sweeping an asymmetrical 2-symbol kernel along x-axis rows or from XOR kernels applied at varying y-column positions swept at any angle. y-axis data is recovered in the same way as x-axis data with a 90° kernel rotation (FIG. 2). Typically, there will be many 2D locations in a sample image from which each constituent bit can be decoded and this redundancy utilised for error detection and correction with, for instance, simple-majority logic. Furthermore, extracted bit-vectors can be significantly longer than the LFSR order and this extra data used for error tolerance (e.g. parity groups overlay differential coding) and, crucially, 4-orientable location. The correspondence between such cyclic codes and the enormous body of work in error detection and correction codes (CRCs, BCH, etc.) is notable, and well-known techniques apply. These include decoding of LFSR sequences to canonical binary representation with look-up tables or computing discrete logarithms assisted by polynomials having small prime factors (as above). Additionally, LFSR search solutions (position following described in preferred embodiments) yield exceptionally simple and fast error-correcting decode.

Before LFSR decode can occur, however, symbols must be extracted from an arbitrarily aligned sample window. A frequency spectrum of a halftone dot grid is analysable by well-known methods, e.g. the Fast Fourier Transform (FFT), to yield grid pitch, angle and x-y phase-shift data. These affine transform parameters are used to realign the sampling grid (pixel array) back to the symbol grid (scale array), and hence extract symbol sequences. Dot symbols marking both 0 and 1 inject useful frequency information even in the presence of large patches of zeros (FIG. 2). Phase information of FFT frequency peaks (FIG. 7, 702) gives an estimate of fractional offset of grid position, with attainable interpolation accuracy roughly proportional to the quantity of input information, i.e. camera resolution. Due to symmetry, however, FFT-derived angle provides angular alignment within just one quadrant. Resolving quadrants fully (360° or 4-orientable) has two further requirements: ability to distinguish between axes (e.g. 90° rotations), and decode bit-reversed (180° rotated) sequences. Restated, valid sequence codewords and their bit-reversed values must be unique among all possible sequence codewords. The present invention provides two complimentary solutions to this: sparse coding, and decoding vectors longer than the LFSR-order. Firstly, both x and y can be coded by the same polynomial and occupy small, disjoint regions in the complete $2^n-1$ number field for an LFSR order of n. Decoding a valid position sequence of length n will then identify position and axis. Secondly, n+m bits can be decoded to differentiate any overlapping codes caused by bit-reversals. For instance, for the order-22 LFSR code described previously, if x starts at code [1100000101100011110000] and y at [1011010100100110010011], and both span 65,000 positions, m needs to be 12 or greater.

Summarising the aforementioned exemplary embodiment: two 16-bit axis values can be unambiguously reconstructed from 35-bit codewords (n+1+m=22+1+12) while simultaneously providing error detection. A typical megapixel image sample presents sequence vectors of many i.e. hundreds of symbols (much longer than the minimum codeword size), each determined from a cadre of many i.e. hundreds of decode opportunities, thus affording very robust decoding with error detection/correction and a wealth of information on signal-chain integrity. Additionally, such resolutions can provide up to approximately 20 bits of useful interpolation or fractional positioning per axis.

DETAILED DESCRIPTION OF PREFERRED IMPLEMENTATIONS

Decode Process

Figure 7:
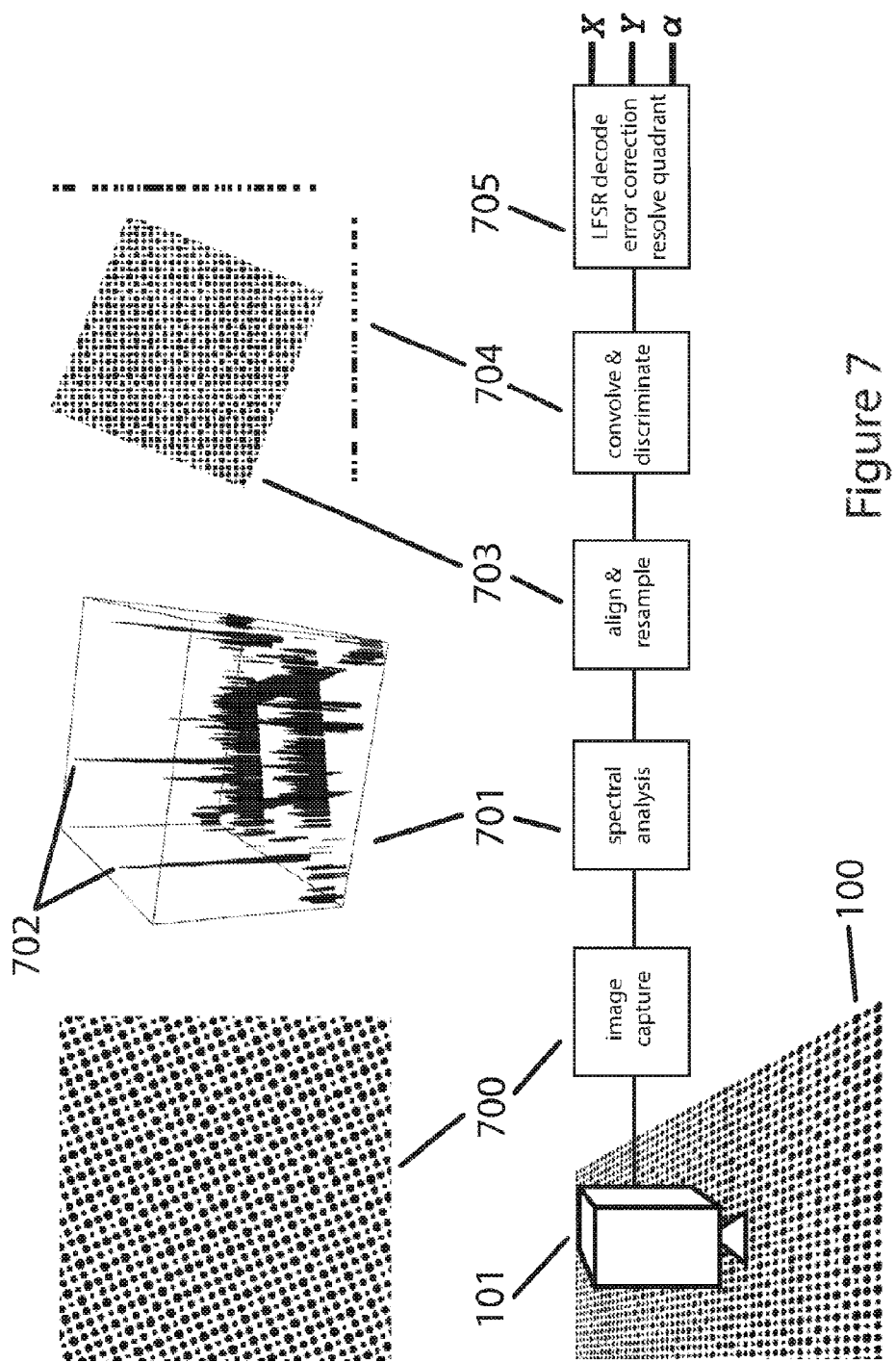
FIG. 7 shows a Processing Algorithm Block Diagram according to an embodiment of the present invention, wherein the scale, 100, captured at an arbitrary x-y offset and angle by the camera, 101, produces an input image, 700. 2D Fourier analysis, 701, finds peaks in the spectrum, 702, corresponding to the dominant dot-grid frequency which provide both angle and phase (interpolation) information to guide affine transformation and image resampling. The realigned pattern, 703, is processed with appropriate kernels to extract an LFSR symbol-sequence vector for each dimension, 704. These vectors are then further decoded, 705, to identify each axis, and the discrete coordinate thereof, and the quadrant of rotation to which fractional parts are added to give the final result.

The preferred embodiment decode pipeline from scale, 100, to position output is depicted in FIG. 7, and is now disclosed in the order of that flow.

Scale Symbol Representation and Implementation

The preferred halftone representation of digits is depicted in the drawings with area of circular dots proportional to digit value. When imaged, this translates to a greyscale distributed over several pixels and subsequently a number closely related to the original digit value when these pixels are correctly resampled and integrated. Circular dots have the advantage of being constant under rotation and easily printed, but it will be noted that any convenient pattern may be used including, but not limited to, lines, squares, superimposed printing inks with subtractive overlay properties, multi-dot symbols, or full greyscale patterns—and as such fall within the scope of the present invention. XOR combination produces 2-value symbol arrays, 200, 500. Linear addition produces 3-values (300, 400) for two axis combination, and 4-value symbols for 3-axis combinations (600). For illustrative purposes, FIGS. 2 to 6 have axis data separated out (201, 202, 502, 503, 504, etc. which normally do not form part of the scale) to show LFSR sequence generation (203, 501) and scale construction. Scales may be printed, projected, holographic, or rendered by other means.

A significant advantage of the present invention is that scale pattern construction is computationally straight forward due to separability of axis sequence generation and simplicity of axis symbol combination. Indeed, it will be understood by one skilled in the art that patterns may be produced iteratively line-by-line, block-by-block, or symbol-by-symbol using CPU, GPU or hardware for raster-based systems such as a scanning laser writer. Realtime, on-the-fly pattern generation obviates very lengthy processing times for intermediate file formats (e.g. Gerber, CIF) and enormous rasterised image output files—potentially terabytes per square metre of scale. Hence, a direct-write lithography or photo plotting scale manufacturing system utilising these position coding schemes can enable customised or one-off scales to be manufactured at little or no additional cost using.

Isometric grids (500, 600), using a different LFSR polynomial and larger kernels (505, 506, 507) have a redundant axis and are decoded by kernel covering a minimum of 4 symbols. A high aspect ratio window, 604, extracts very little information from the y axis, but sufficient from x and w to locate position by simple geometric calculation. No matter the angle or translation, such a window accesses at least 2 of three axes and can provide higher speed decode. High-aspect-ratio decoding is achievable with window heights somewhat larger than kernel-diameters, in practise around a dozen video lines. As with most redundancy, additional information can be used for error checking. When additional axis position information is not required (e.g. when sample window is large enough), the third-axis can be used to embed ancillary, side-channel data. Furthermore, if a small part of a full m-sequence range is used, as described in the summary, the remaining range can be used for static information, to label scale properties, product identification, manufacturer name, for example. According to an embodiment of the present invention, cryptographic methods can be used to encode some of this data for security or intellectual property protection, e.g. to tie a scale to a specific sensor. According to an embodiment of the present invention, dynamic patterns, say from computer screens or cell phone displays (and using their cameras), can insert data blocks conveniently aligned to position data, to provide movement information and a relative high-bandwidth side-channel. DC-balanced codes appear almost flat grey and, in displayed scale applications, can be sub-coded into existing video with polarity alternated each frame. According to an embodiment of the present invention, foreground video can be cancelled out over two frames leaving a representation of the scale data. Applications may include using the subliminal positioning signal for pointing devices and/or data transfer and bridging the "airgap" between computers.

According to an embodiment of the present invention, dot size variance (modulation) can maximise symbol differences, for example 600, and thereby aid symbol discrimination, providing smallest dots are still printable and largest do not overlap. Low modulation depth, 601, improves interpolation accuracy and can be minimised providing integer position decoding is not compromised. To improve interpolator performance of linear addition patterns further (FIGS. 4 and 6), DC-balance is achieved by inverting alternate lines orthogonal to each axis: on the scale, 400, every square of four dots then sums to the same median value. Data-dependent spectral artefacts leading to interpolation errors can thus be reduced to small edge effects. An adapted kernel (e.g. 401, 402, 602, 603 for the x axis) accounts for modulation. According to other embodiments of the present invention, schemes other than alternating-line inversion are viable such as "chequerboard", modulation over larger groups, or with other weighting functions. (For bi-level XOR patterns, modulation is obviously ineffective.)

Figure 9:
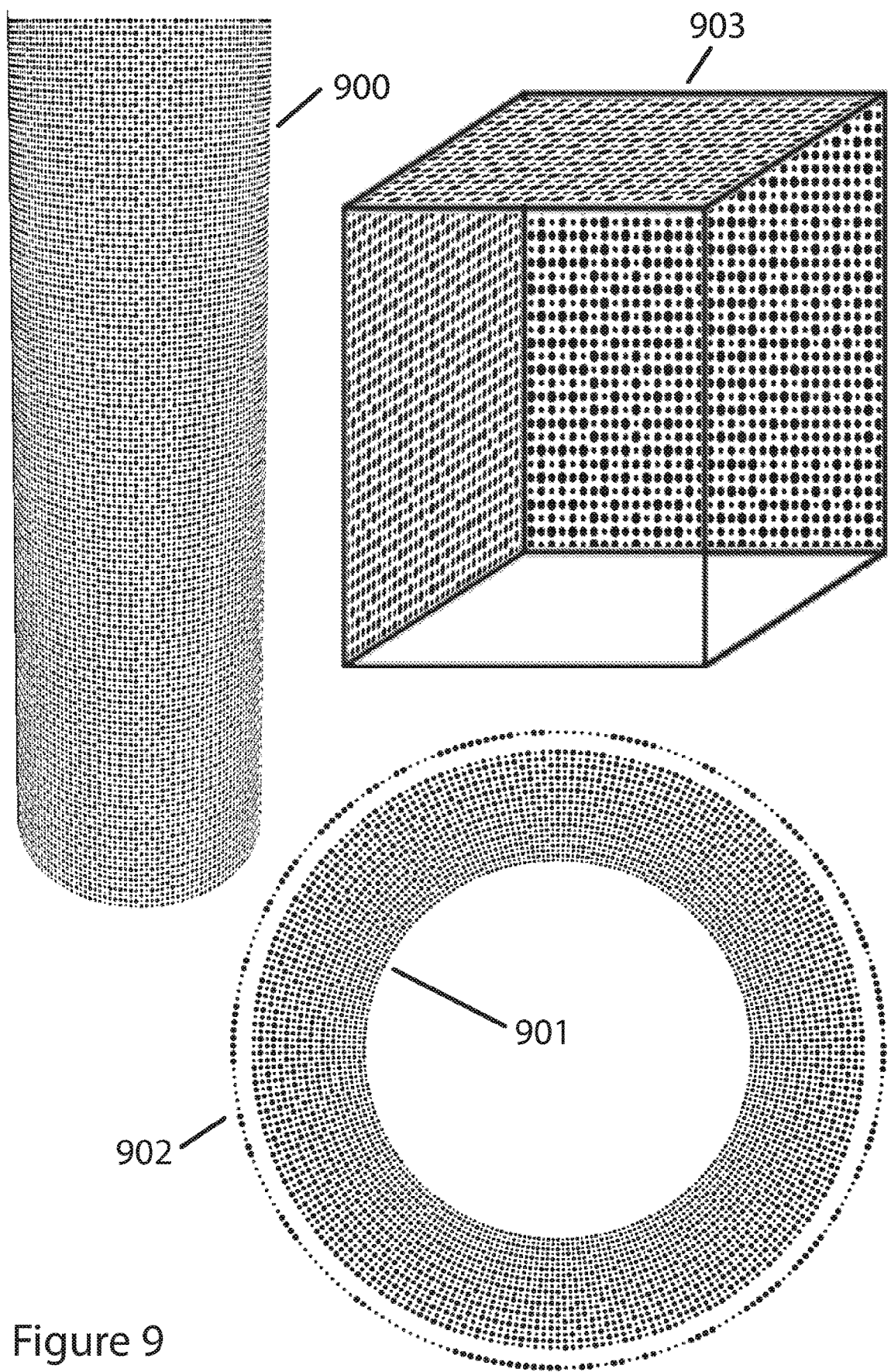
FIG. 9 shows Non-Planar Variants according to an embodiment of the present invention, wherein a non-maximum-length LFSR repeating after an even number of positions is used to wrap a cylinder's circumference, 900, with codes otherwise similar to 400. A polar variant, 901, illustrates the same idea where the circumferential axis, 902, generated by the polynomial $x^{14}+x^{12}+1$, repeats after the $254^{th}$ position. 903 represents a 3D space patterned on multiple walls. 900 and 903 can be imaged by two or more cameras to resolve 6-D spatial position fully.

The present invention is not limited to binary, Galois Field, two-tap LFSR, nor maximum-length sequences (m-sequence). Ternary or higher number bases with a larger symbol alphabet are viable, and polynomial generators can be selected for any specific application. Non-maximum length sequences are useful, for example, since even-number cyclic sequences (902) allow even-odd DC-balanced scale rings (900, 901). Indeed, FIG. 9 illustrates non-planar examples, and one or more camera can be used with them, for instance, to measure runout in any or every dimension on a machine tool spindle. Neither are scales confined to 2D. Circular dots become variable-radius spheres in 3D (hyperspheres in higher dimensions), and the construction and mathematics follows the same rules as in 2D, but uses a cubic lattice rather than the square grid. (Isometric versions lack a 3-space twin.) Kernels now become 3D convolution volumes but are otherwise processed in similar ways. 3D-printing such a lattice is reasonably easy and could have application as reference target or marker field in tomography, Mill, X-ray, or any volume-imaging application. Physical implementations of hyperspace are unknown, but hierarchical, time-sequence sampling—like multi-dimensional video—or n-D computer arrays using the present invention, are readily imaginable and applications may include data transmission and global positioning systems.

The scale grid establishes the metrology reference and system accuracy relies fundamentally on scale accuracy. However, small localised imperfections will be averaged out over the sampling window providing there is little or no correlation with the underlying grid periodicity.

Image Capture

Figure 8:
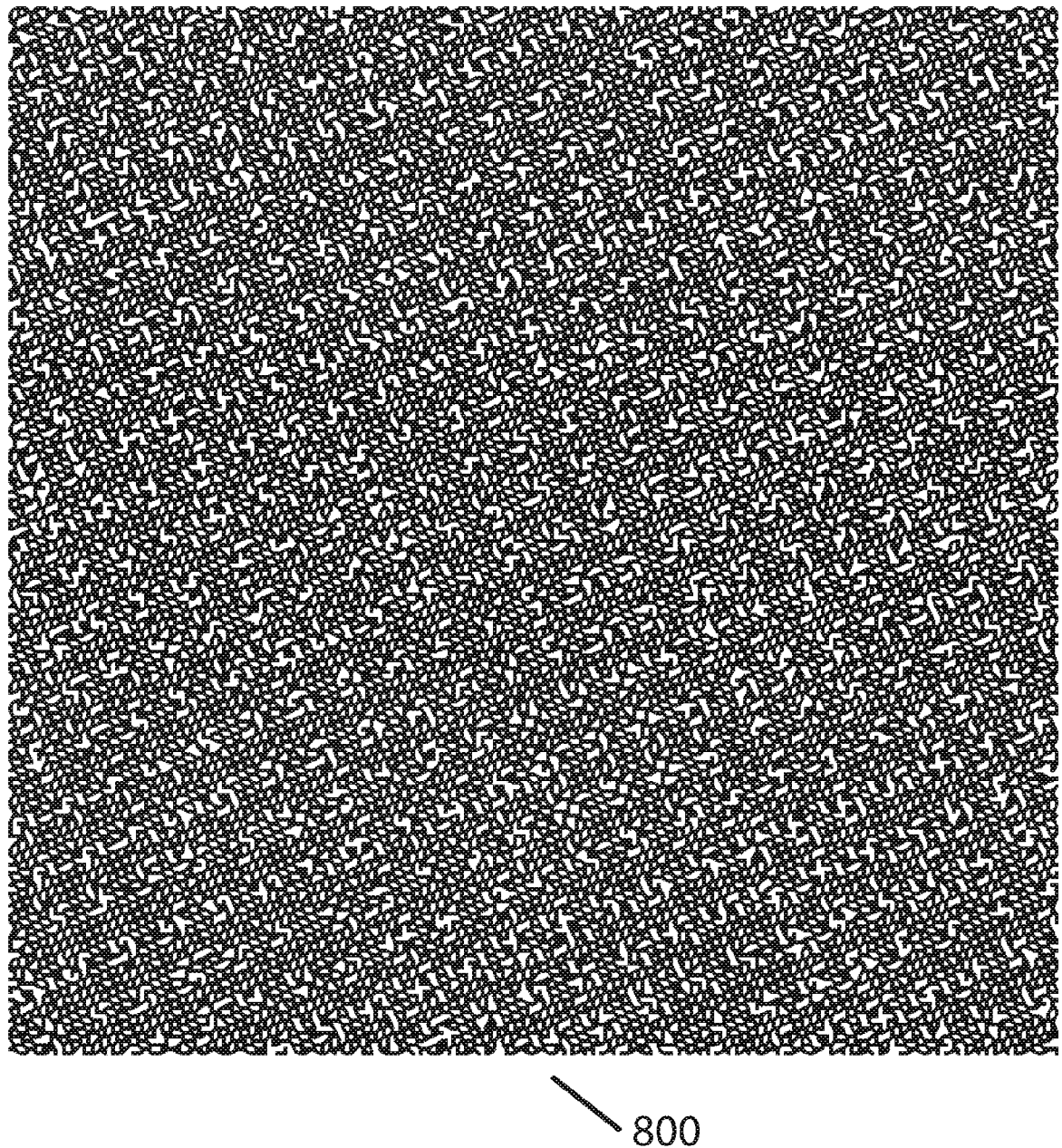
FIG. 8 shows a 1-Bit-Per-Pixel Image Capture Example according to an embodiment of the present invention wherein an input image, 800, captured at 256×256 resolution with a 1-bit threshold "grey level". This is an illustration of an image of a camera, similar to 700, at an angle of 22.5° and a magnification of 2.16 pixels per halftone dot. Despite gross artefacts from sampling near the Nyquist limit and apparent lack of any definition remaining from the original image, it is nonetheless robustly decodable by the signal chain of FIG. 7.

The scale grid, not optics, primarily defines x-y-α accuracy, providing the optical axis is maintained perfectly at right-angles to the scale. Hence, data is captured by an imaging device comprising a sensor pixel array without onerous constraints on focus or magnification and is digitised with analogue-to-digital converters, ADCs, for subsequent processing. Typically, motion blur is eliminated by strobed scale illumination. ADCs with 8 or more bits of resolution are typical, but the speed, complexity, and power consumption of conversion are related to the bit-depth. Pixel data is averaged over many sites according to a preferred embodiment of the present invention, and therefore even one-bit ADCs handling extremely high-speed (mega-Hz frame rates) could be workable at the expense of interpolation accuracy. FIG. 8 depicts a 1-bit sampled image.

Figure 10:
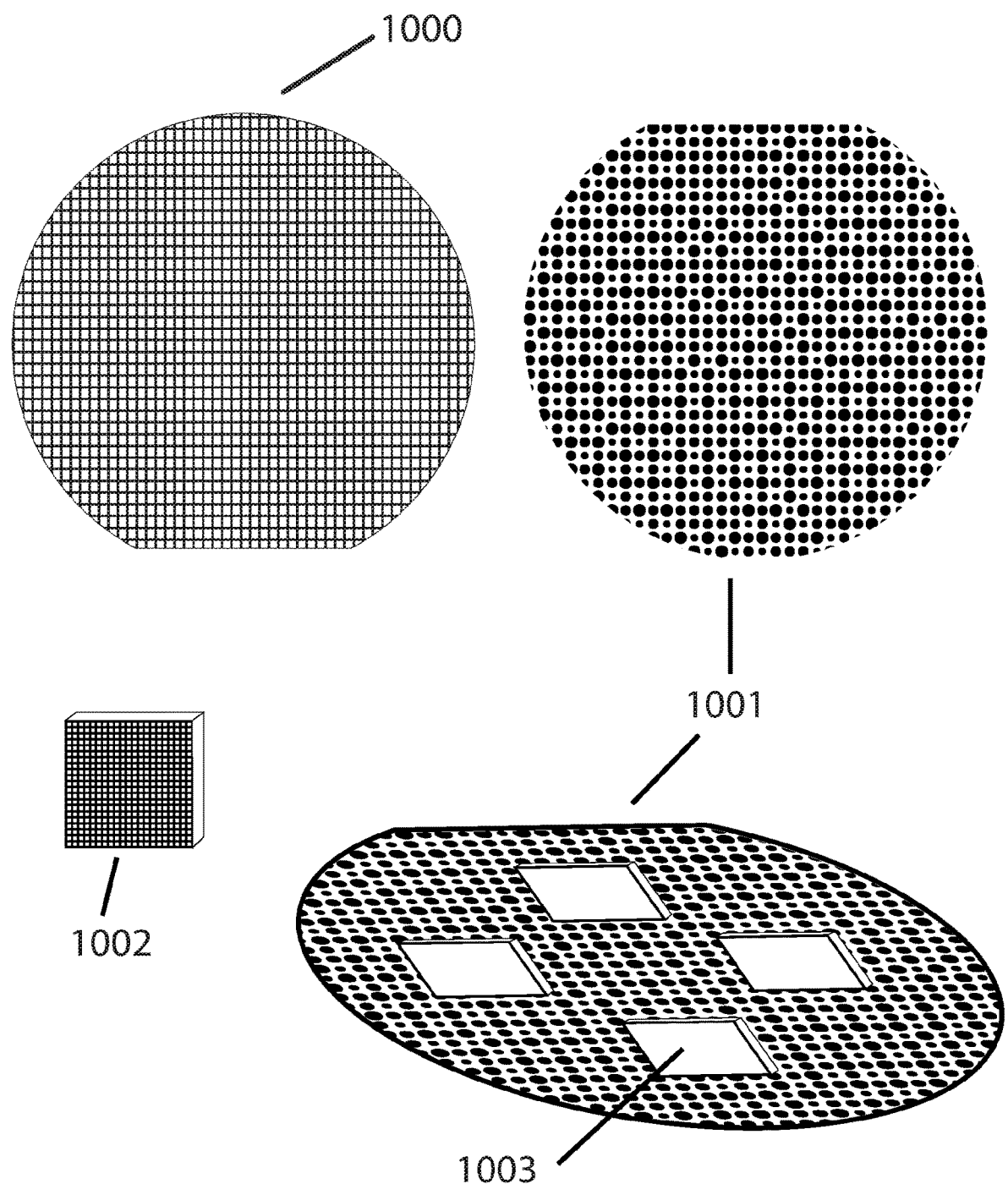
FIG. 10 shows Silicon Wafer Flip-Side Scale And Actuator example wherein the front-side of the wafer, 1000, on which circuit layers are built up in many process steps, is permanently registered to a flip-side metallic or capacitive scale, 1001. A sensor/actuator chip with a surface array of plate capacitors, 1002, wherein voltage on each capacitor may be sensed or driven. 1002 detects the wafer position when placed, 1003, in close proximity to the flip-side of the wafer. In this example, four chips adjust their plate charge patterns to align the scale grid to any desired position and support large wafer traversals and rotations (yaw), with the additional possibility of fine sensing and control of pitch, roll and height gap. The scale grid and chip array sizes are exaggerated and supporting structures such as air bearing beds are omitted for clarity.

To one skilled in the art, it will be clear that the present invention is not limited to optical systems, CMOS image sensors, nor specific scale technologies. Other sensor types such as magnetic, electrostatic, micromechanical, and so on, can be used as appropriate. For example, a lithographically defined scale on the flip-side of semiconductor wafers could be sensed electrostatically by an integrated array of capacitive sensors in proximity to the scale and processed in a similar way to the photo-diode arrays of commodity camera chips. However, unlike optical systems this would not be diffraction limited, and sub-micron dot-pitches for the scale and sensor are a real possibility. With the scale carried through manufacturing attached to the flip side of the wafer, this embodiment enables repeatable, sub-nanometre mask alignment over many lithographic and process steps. In wafer-to-wafer bonding (stacking, or "3D manufacturing"), the scale provides an alignment guide on the accessible, outer faces of two wafers that are to be bonded, thus greatly simplifying bringing together the inaccessible and invisible active inner layers with the extraordinary precision normally required. A further advantage of electrostatic operation is that a sensor chip can double as an enhanced Sawyer Motor, or multi-dimensional positioning actuator. The same array of plate capacitors can be alternately used as sensors and actuator drivers, or the two functions accomplished by separate chips as in FIG. 10. By selectively charging capacitor plates of the sensor/actuator array, for example as illustrated in FIG. 8, forces of electrostatic attraction or repulsion are exerted on the scale grid which itself is an array of capacitors. Scale-like driver patterns, when offset slightly from where the scale grid is sensed to be, tend exert forces that will align actuator and scale charge patterns, so generating motion in any desired direction. It should be noted that orthogonal translation (non-rotational movement) of such patterns can simply be accomplished by shifting pattern data across the plate capacitor array. In this scenario, the wafer could be the sole moving part, thereby obviating complex and costly ultra-precision stages in wafer steppers. In other embodiments, magnetic or micromechanical scale and sensor interactions could be used to similar effect.

Figure 1:
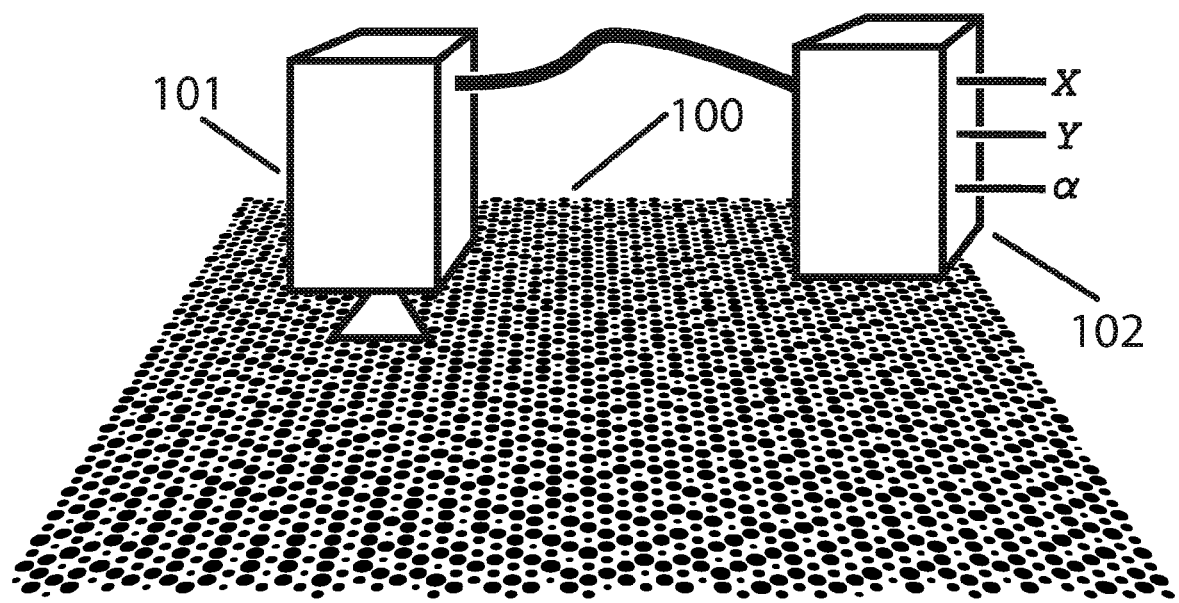
FIG. 1 shows a system diagram according to an embodiment of the present invention which shows a printed pattern or reference scale, 100, imaged by a camera, 101, with connected image processing unit, 102, wherein the system produces x-y-a coordinates of the camera relative to the scale.
Figure 2:
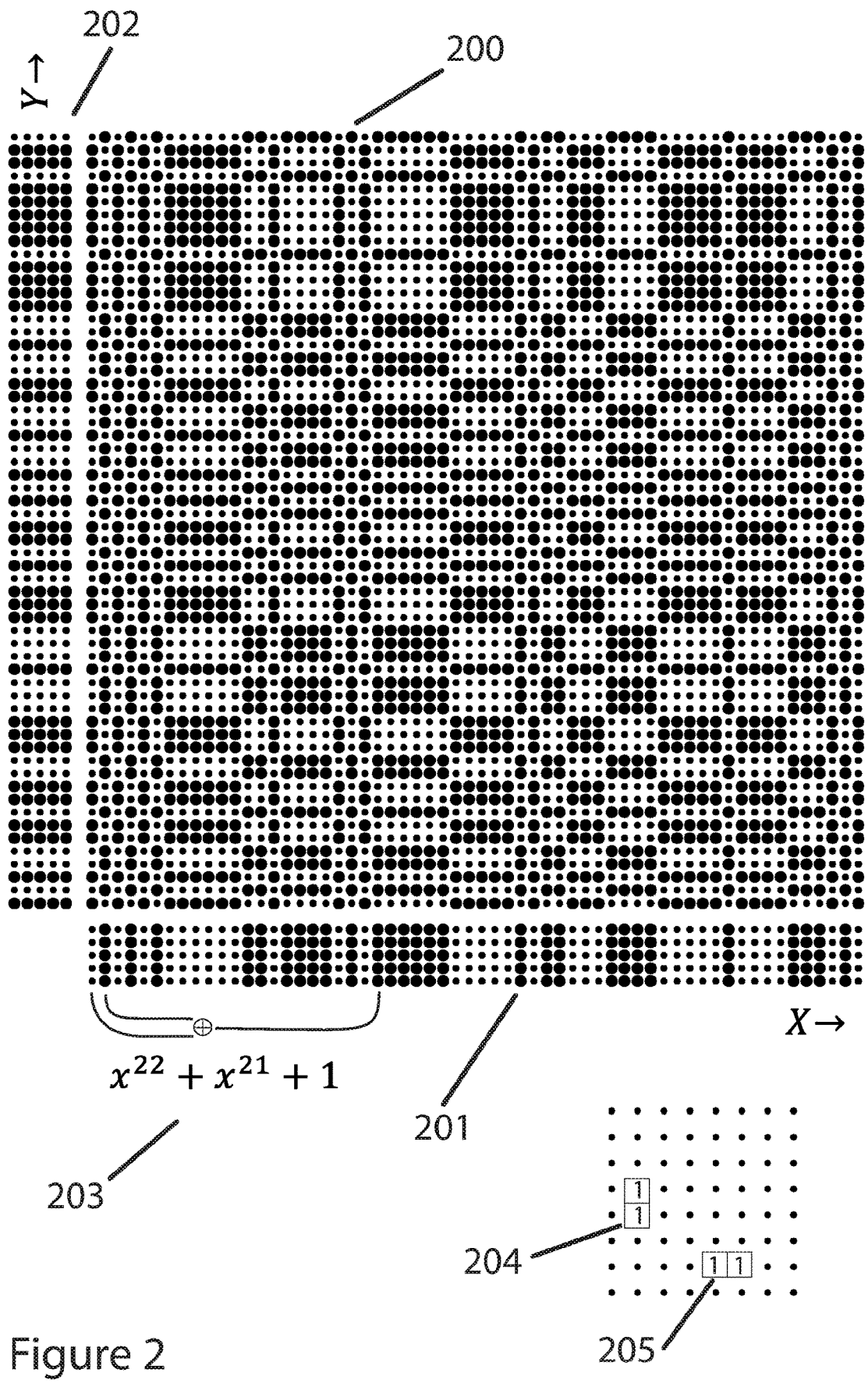
FIG. 2 shows a 2-Axis XOR Pattern Construction according to an embodiment of the present invention, wherein a binary-coded pattern represented by two-value halftone dots, 200, constructed by taking an x-axis LFSR sequence, 201, and a y-axis LFSR sequence, 202, and summing modulo-2 intersecting bits (XOR of rows and columns). The LFSR generator polynomial, 203, is chosen such that one bit of the LFSR sequence is recoverable from the XOR of two adjacent bits or dot values on the same axis which cancels out the value of the orthogonal axis. The kernels expressing this relation are shown for x, 205, and y, 204, and are applied with modulo-2 arithmetic.
Figure 3:
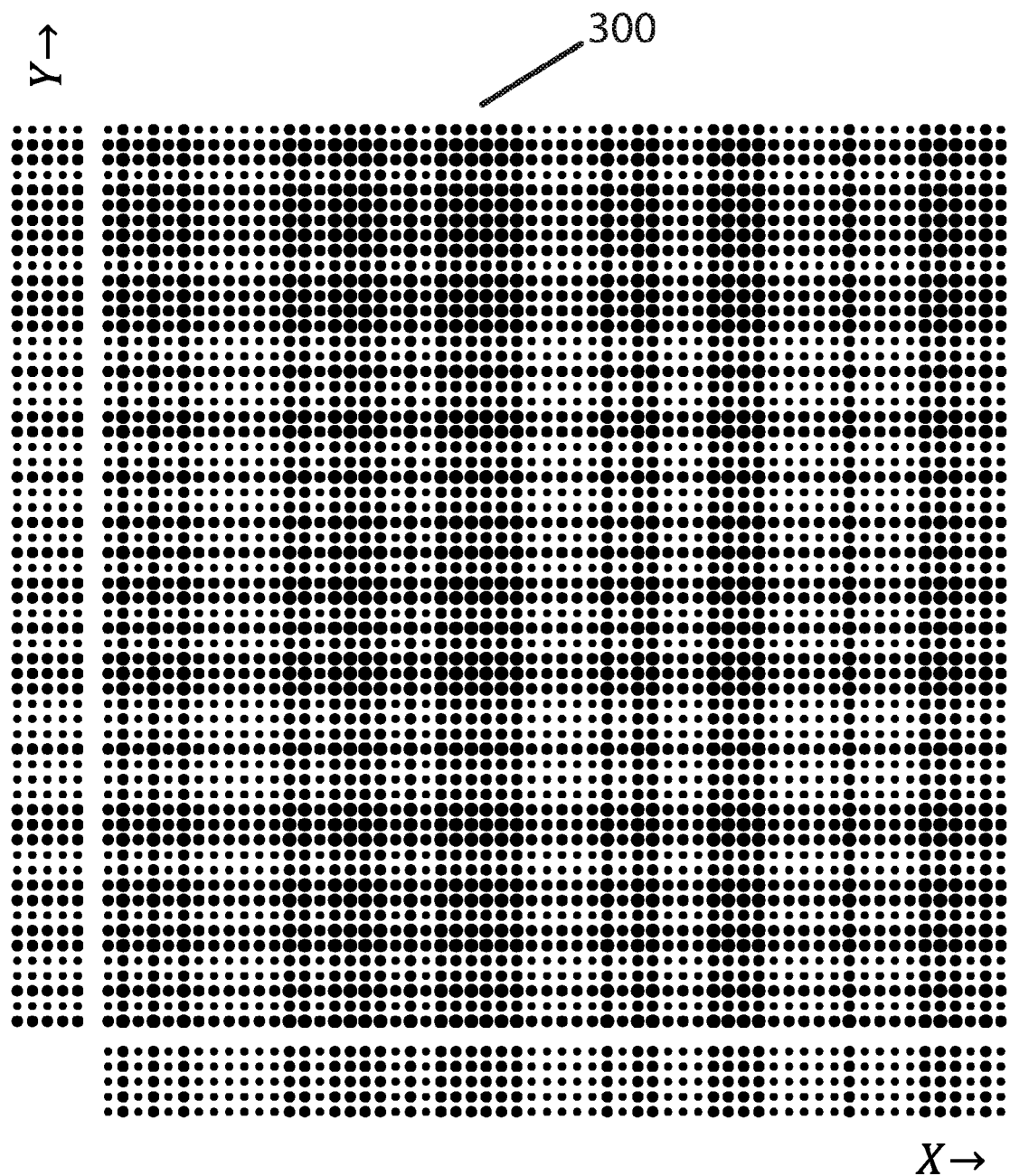
FIG. 3 shows a 2-Axis Linear Addition Pattern Construction according to an embodiment of the present invention, wherein a scale, 300, similar to 200 except in that the summation of intersecting bits from each axis is a linear addition represented by three-value halftone dots. The corresponding kernels, 301 and 302, use linear arithmetic.
Figure 3:
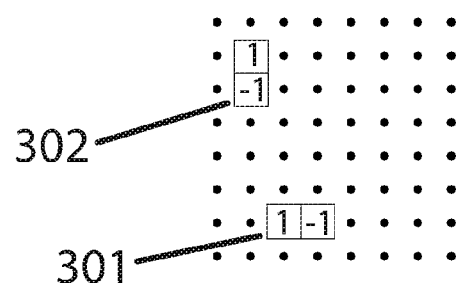
Figure 4:
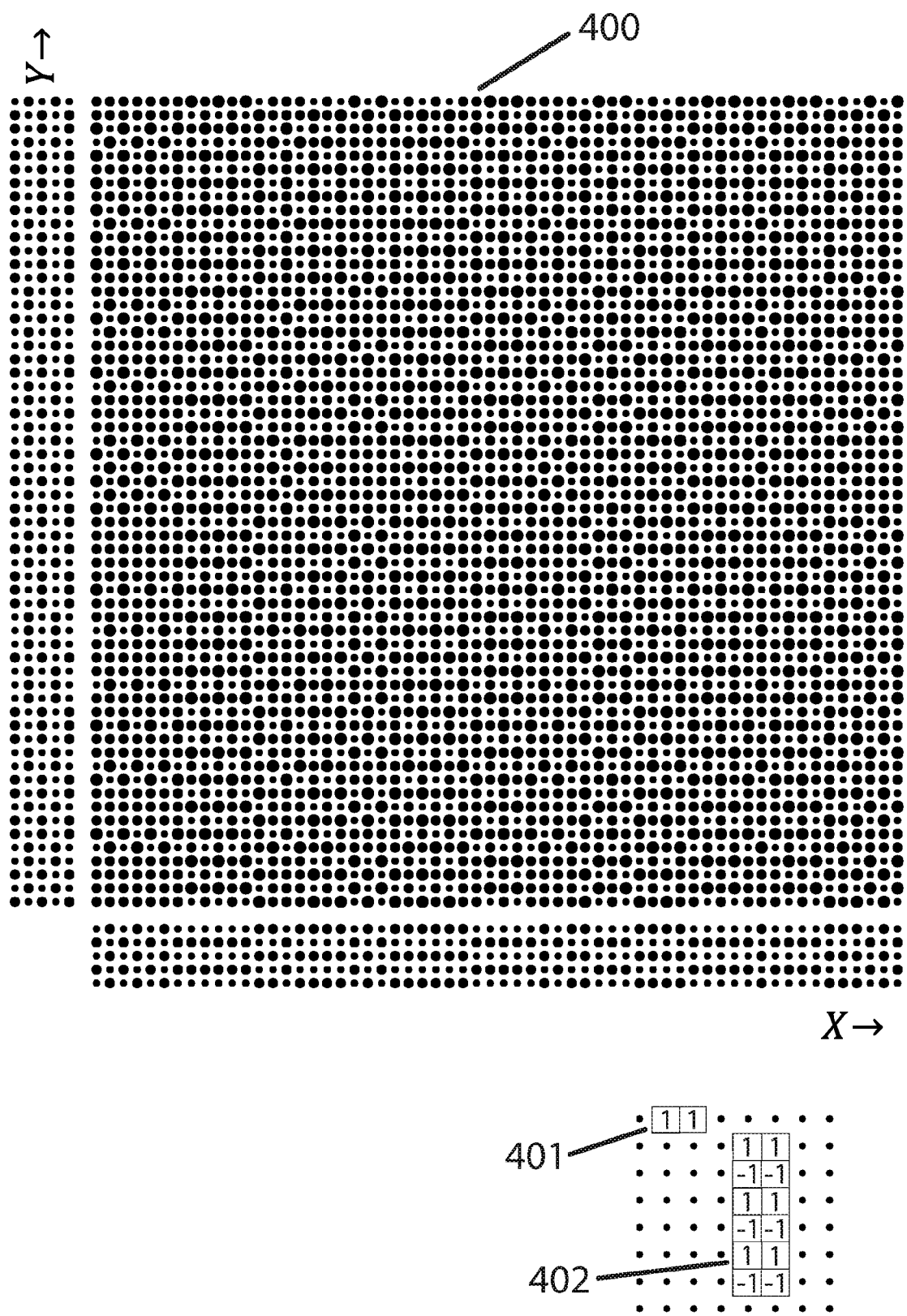
FIG. 4 shows a 2-Axis Additive Alternating Line Pattern Construction according to an embodiment of the present invention, wherein a scale, 400, similar to 300 except in that the LFSR bit pattern of each axis is negated on alternating lines to achieve a zero DC bias. The x kernel, 401, using linear addition cancels out the alternating y values. According to an embodiment, the x kernel can be extended, as in 402, to aggregate and average contributions of multiple rows.
Figure 5:
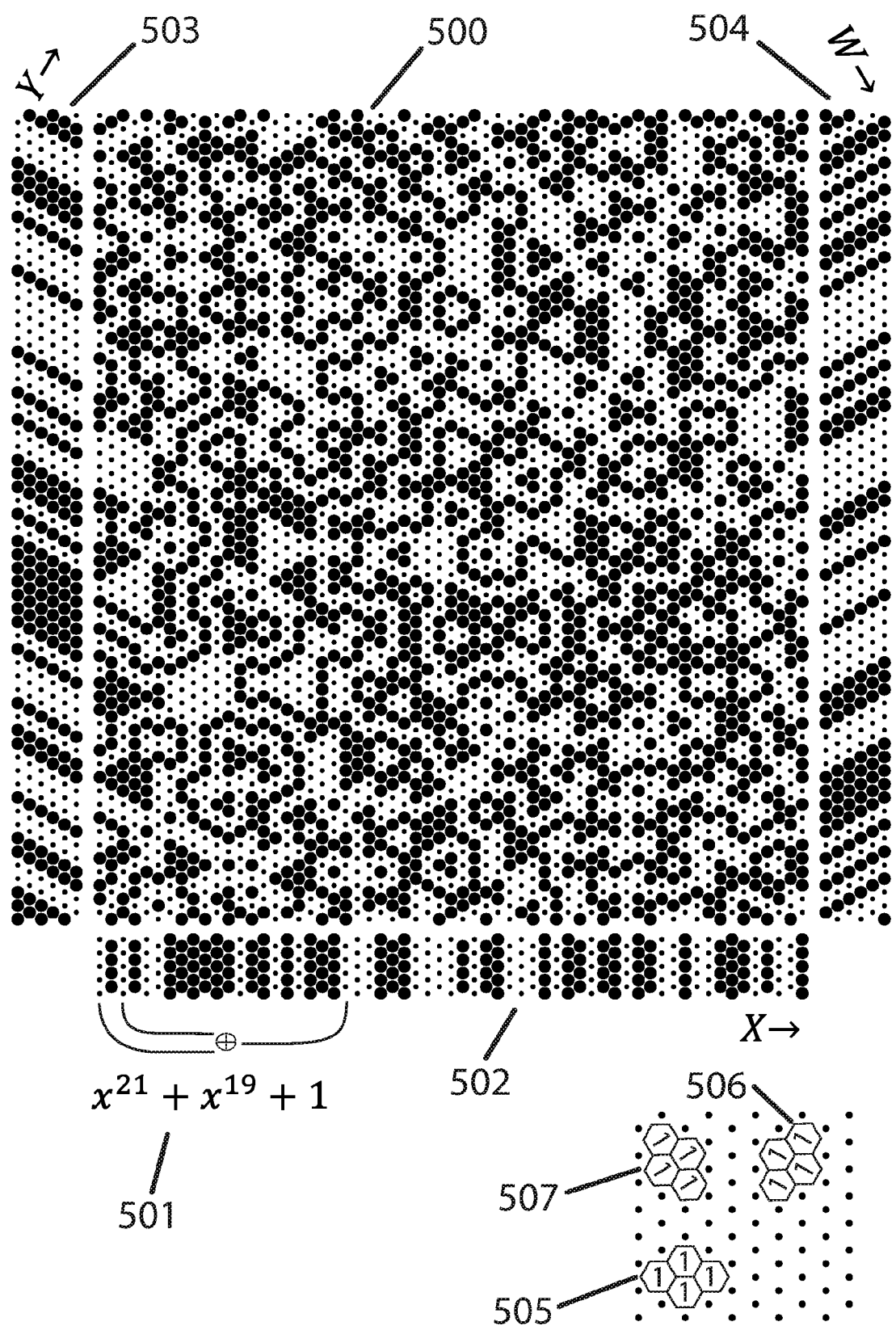
FIG. 5 shows a 3-Axis XOR Isometric Pattern Construction according to an embodiment of the present invention, wherein a scale, 500, similar to 200 except in that three axes are provided and a different LFSR polynomial, 501, is chosen. Again, the bit values from x, 502, y, 503, and the additional axis w, 504, are summed modulo-2 at each projected intersection. The three x-y-w kernels for this construction are represented as 505, 506, and 507 respectively and use four positions (instead of two previously) to extract one code bit on each axis.
Figure 6:
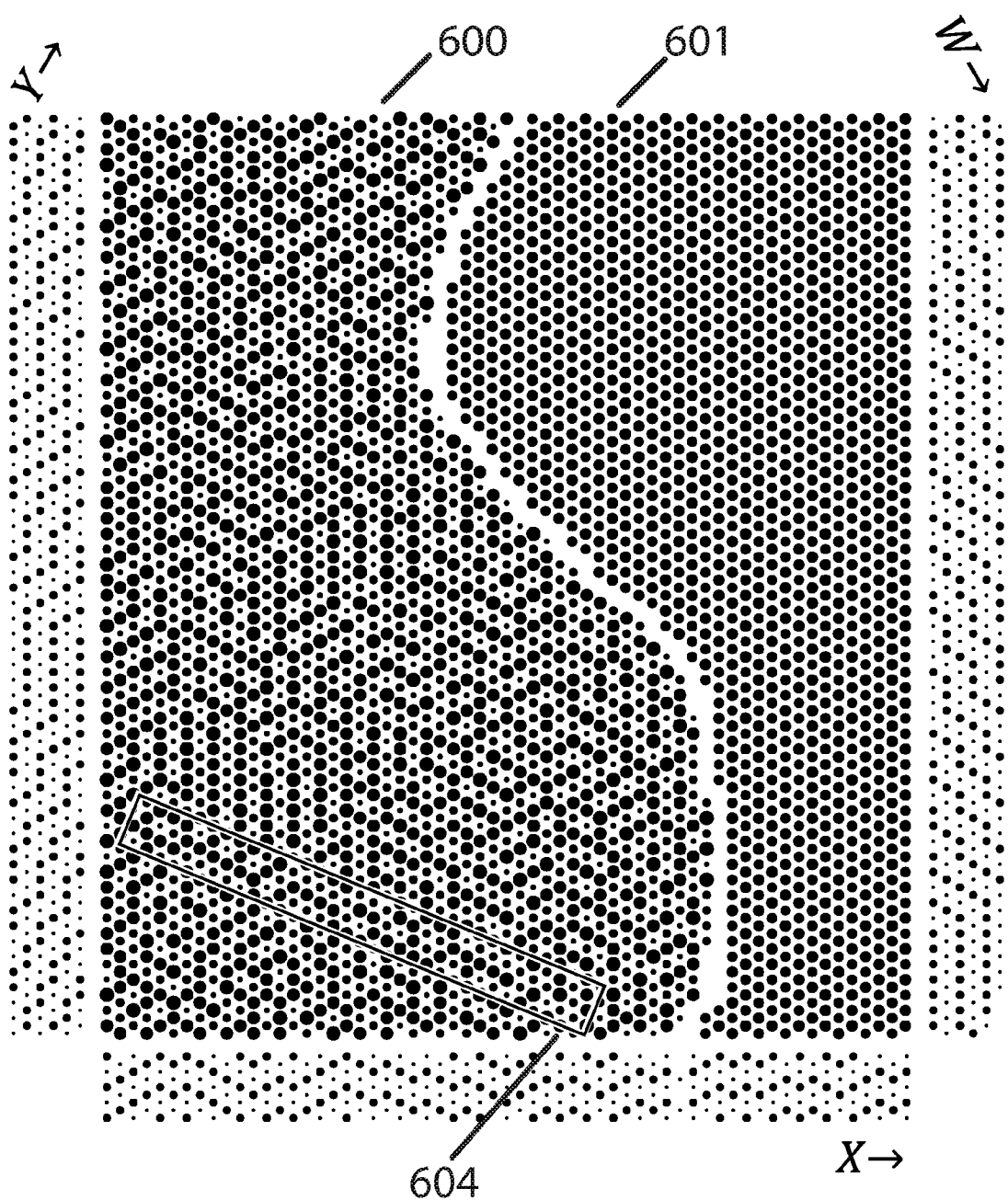
FIG. 6 shows a 3-Axis Additive Alternating Line Isometric Pattern Construction according to an embodiment of the present invention, wherein a scale, 600, similar to 500 with 4-level halftone dots representing the linear addition of the bit value of each axis, and wherein alternate rows are also negated as in FIG. 4. According to an embodiment of the present invention, an alternate scale, 601, reduces the halftone dot differences to improved interpolation. The decode kernel for x, 602, takes four positions to reproduce one bit, but may be extended, 603, to aggregate values the over many rows. 604 is an approximately minimum window from which values from x and w can be fully decoded. According to an embodiment of the present invention, when an axis cannot be directly decoded (y in this case), it can be inferred from the other two, thus the example window is of sufficient height at any angle.
Figure 6:
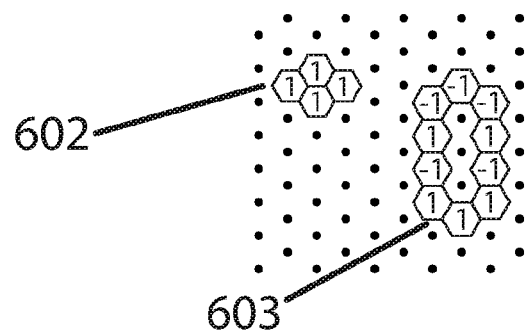

Imaging sufficient data in a high-aspect-ratio window under all rotations is a problem also solved for the scales of FIGS. 2 to 4 by two cameras set at approximately 45° and two processing pipelines (redundant sampling rather than redundant-axis arrangement of FIGS. 5 and 6). Here, at least one camera sees both axes and, when arranged to always capture the axis tangent to the line between cameras, this can improve a calculation accuracies.

The object of using high-aspect-ratio windows is speed. Applications such as metrology that do not need high sample rates can use a larger, slower sensor array. A single sensor can accommodate both, and be dynamically reconfigured (programmable windowing is a common feature of camera chips) to trade off speed for accuracy under different operating conditions. For instance, high-speed continuous servo motion and instantaneous, high-resolution metrology.

Spectral Analysis, FFT

The well-known 2D FFT, 701, provides an efficient spectral analysis tool and convenient vehicle to illustrate this component of the present invention. Frequency—distance of peaks from centre—relates to magnification or pixels per dot. Angle around FFT centre-lines of the four peaks corresponds to α with, at this stage, indeterminate quadrant. Phase (calculated as arctangent of the complex FFT output) of two orthogonal peaks, 702, produces the prized fractional part of prospective x-y positions. (Since FFT input is real, half the outputs are duplicate and 2 peaks redundant.) FFT outputs are discretised frequency-bins and therefore cannot yield smooth and precise results from a single bin, or FFT output pixel. However, well-known methods produce far superior, "sub-pixel" characterisation using calculations including neighbouring bins around the peaks. Furthermore, since coding is essentially linear (row/column summation) and the Fourier Transform linear also, the contribution of row and column symbol values to sample window asymmetry and interpolation bias will, to the first order, be separable and linear. In other words, given successful decode of the integer position, pre-calculated error maps or empirical calibrations can be applied as a series of fine interpolation corrections and, importantly, each codeword bit can be considered independently in the process.

In a preferred embodiment of the present invention, only a small fraction of frequency bins (data around peaks, 702) are utilised and this presents significant opportunities for optimising this computationally demanding decode stage. Peaks can be determined from the first few video lines or rows, and subsequently only two or three small regions calculated in the second vertical dimension of a separable 2D FFT computation—one region of columns for each horizontal peak. Real-input horizontal FFTs require half the computation of vertical FFTs, hence for square-format video, 75% of computational resource and power can be saved, and memory requirements decimated. Early estimation and other constraints may also be applied to pruning horizontal FFT calculations and buffering, but more significantly can decimate frame-store requirements and reduce system latency since resampling (the next processing stage) starts much earlier. In summary, a fast, rough, but good-enough estimate is made to guide resampling, followed by a more accurate phase calculation that makes full use of all data to get the best possible interpolation results.

The search for peaks in the FFT output can be directed and qualified by static and dynamic system constraints. For instance, if magnification or α is known a priori or can be predicted (as is normal in real-world kinematics), then less computation is generally needed and higher confidence results can be garnered. If α and magnification are fixed or variation small, full FFTs may not be needed at all and interpolation computation reduced by an order of magnitude. Note three peaks from a total of six would be used for isometric scale grids.

The previous treatment considers digital computation of Fourier transforms. However, such spectral analysis is not limited to electronic implementation. Optical-domain processing is known in the art and could provide simple, virtually instantaneous Fourier transform results for use in subsequent processing either electronically or otherwise.

Align and Resample

Resampling uses FFT-derived affine-transform information to reduce the input frame to a one-symbol-per-entry array, 703, by rotating and downsizing wherein the symbol grid is aligned to output array rows and columns. Integration of source pixels by area-preserving resampling is preferred over bi-cubic and other resizing algorithms to preserve linearity. The process is well suited to GPUs and, for example, can be implemented as an over-sampling, anti-aliased texture mapping. Lens distortion and shading corrections can be applied in this process also.

The 2D resampled output array generally forms an inclined rectangle within a larger array, and at its edges symbols that are only partially captured should be rejected. The corners of the inclined rectangle will contain fewer symbol repetitions than at the centre where there is a longer diagonal, and this is accounted for in averaging or weighting the output row or column. Depending on the aspect ratio of the input and its angle, the width and depth of valid output samples varies with some rows and columns having no valid data. A mask array can be generated to qualify which output symbol pixels are of use.

In the isometric cases, resampling can include a shear component in the affine transform such that the output array becomes a rhomboid with, for example, the w axis on a diagonal and x-y on rows and columns.

Convolution Kernels, Digital Discrimination

In a preferred embodiment of the present invention, with symbols realigned, 703, kernels are applied to extract 1D symbol vectors, 704, for each axis. Kernel operations are convolutions in the mathematical sense: multiply by the kernel values and sum results at each valid site. Generally, in the realigned array, symbol values will be represented by signed, zero-centred values, i.e. a 3-valued system will have symbol values of nominally +1.0, 0.0, and −1.0, but will vary due to sampling artefacts and noise. Discrimination refers to converting analogue values into binary vectors, one for each axis, by thresholding kernel calculation results. Since thresholding is applied to absolute differences (reversing differential coding: a large difference signifies 1, a small result 0), this represents a non-linear operation in the signal chain. (For ternary or other number systems, discrimination digitises by slicing a more complex eye diagram.) In the examples of FIGS. 2 and 5, each kernel calculation results in one bit of information after discrimination and for multiple locations on the same row or column, many binary values are reduced to single vector bit by taking an error-correcting majority vote. For the examples of FIGS. 3, 4, and 6, the same process may be used (e.g. kernel 401), however, linear combination scales preferably use a convolution over row/column sites with the largest kernel possible. In other words, discrimination and non-linearity is deferred, and what was digital majority voting now becomes averaging in the analogue domain. This has significant advantage in the presence of noise and may simplify implementation logic. Kernel 402 for the x axis illustrates this with alternating signs on y to account for DC-balancing modulation. Isometric kernel 603 shows significantly fewer symbols are used (2 per site plus end stops) compared to the XOR version (4 symbols per site), and thus achieves better noise immunity than its Galois field cousin, 503.

It will be recognised by those skilled in the art that resample, convolve, and discriminate may be combined into a single pipeline stage to simplify computation and obviate intermediate frame-buffering.

LFSR Decode, Error Detection/Correction, Resolve Quadrant

In a preferred embodiment of the present invention, bit vectors, 704, can be decoded to produce the integer portion of the position output by various known means including discrete logarithm, lookup table, and searching a reference LFSR symbol string. The resolved quadrant and x-y integer translations are added to interpolated fractions of the spectral analysis stage for final output. While trivial to encode, LFSR sequences are relatively expensive to decode and the process will be compounded by larger vectors that may contain errors. However, static system conditions, intra- and inter-frame information or constraints can reduce algorithmic complexity and/or improve confidence in the result at several stages of the pipeline including LFSR decode. Static information, for example, includes maximum travel of a CNC machine where x-y integer spans would typically be in the thousands rather than millions for some m-sequences. Such information can reduce search time to practical levels, typically milliseconds.

In a preferred embodiment of the present invention, a computationally intensive and potentially slow calculation of initial position is found from the complete space of possibilities. Then, after an initial fix with full and unequivocal calculation of 4-orientation and position, subsequent samples are highly constrained by system kinematics and are more simply calculated. Typical machine velocity and acceleration maxima limit position translations between samples to very few integer shifts, e.g. at 10 kHz sampling, 10 ms$^{-1}$, and 100 µm scale pitch, to no more than 10, and yet fewer if acceleration is accounted for. Similarly, an instantaneous 90° rotation is unthinkable, and once an angular fix is established, decode can track without needing to resolve quadrants or vector reversals. Given that it is almost trivial to extend LFSR strings around a seed (a previous position fix), the position vector decode may now be implemented as a cross-correlation function over, say, 16 locations on that extended string. Essentially, Hamming distance is calculated between input vector and possible next positions, and the result with lowest distance (fewest errors) wins. The Hamming distance of the best fit and other candidates give a good indication of system health and noise margin and can be used to decide when tracking has failed and unconstrained decode should restart, or a hard error raised and emergency system shut down invoked. It will be understood that the input vector is typically over 100 bits with substantial redundancy, and this method is an efficient way to achieve error detection and correction over long and variable-length vector inputs. Furthermore, it can be calculated by hardware in nanoseconds.

As an example of error correction capabilities for the order-22 LFSR (FIGS. 2, 3, and 4) under kinematic constraints and with initial position identified: a 100-bit input vector, when travel is limited to 2000 dots (200 mm at 0.1 mm dot pitch), correlated to 16 potential target locations, yields a minimum Hamming distance of 27. At least 13% of bits in error can be corrected in the 100-bit input compared to 4% for the unconstrained case with travel of 65000 dots. Note that this LFSR example is nowhere near a "perfect code", so that while any and every error up to 13 bits can be corrected, most inputs with even more bits in error will be correctable or detectable.

For linear combination scales (FIGS. 3, 4, and 6), the output vectors, 704, can be usefully maintained in the analogue domain. Here, large kernels naturally weight each bit-position with number of sites covered, and the strength of the result reflects agreement amongst aggregated samples (code repetitions). The previous binary Hamming distance calculation now evolves to an analogue correlation function yielding a form of maximum-likelihood output.

The parity properties of the example LFSR polynomials can also be used for error correction.

Alternatively, parity and other cues such as analysis of regions that lack the high-frequency data characteristic of the dot pattern, may be used to excluding dubious results from Hamming distance and correlation calculations. Where large scale areas may be occluded, for instance in marker field applications, more complex image processing algorithms may be implemented to make the best of the sample image. In summary, the present invention presents a powerful "concatenated error correction code" using repetition codes, parity, Hamming distance or correlation, kinematic constraints, and other cues that enables reliable retrieval of integer position even from signals buried in noise.

Additional Coding Axes

The previous treatment considers a system constrained to planar motion where a scale acts as primary metrology reference. However, in a preferred embodiment of the present invention, up to the full six degrees of freedom can be measured by an adapted, single-camera system, albeit with lower accuracy. With simple lenses, the dot pitch in the sampled image gives a direct height indication, z, of the camera from the scale and if this height is calibrated, z can be calculated. z accuracy now relies on dot-pitch frequency interpolation accuracy (which can be parts per million) as a fraction of the effective optical path length. Rather than a reference dot pitch of 100 µm or less, z could be a fraction of perhaps 20 mm and in many applications, such as 3D mice and video game controllers, this is easily good enough. The FFT data can also be used to estimate the last two degrees of freedom, camera pitch and roll angles, by analysing peak shapes and deviation from an orthogonal constellation. Alternatively, the sensor array can be segmented into, for example, four windows and these quadrants processed separately to yield perspective information from dot-pitch frequency relationships. In this circumstance, perspective information must inform the resampling process to correctly extract sequences vectors. Providing the system remains reasonably in focus, there is a wealth of information from which to calculate these extra axes by the above or other well-known methods.

The invention claimed is:

1. A computer-implemented method for multi-axis position sensing comprising the steps of:
   capturing, by an imaging device, a partial image of a reference scale;
      wherein the reference scale comprises a plurality of symbols in a grid pattern and each symbol represents a symbol value, and wherein the grid positions of said symbols along a plurality of axes in space are encoded using respective symbol values, wherein the plurality of symbol values each represent a combination of code sequence digits from differentially coded position code sequences along each axis of the plurality of axes, wherein multiple code sequence digits form a codeword of sufficient size to represent a digital position on each of the multiple axes, and wherein said combination is obtained by convolving the code sequence of each axis with a respective kernel based on a separable mathematical kernel to thereby define each symbol value by a respective combination function applied to two or more code sequence digits of each axis, such that said code sequence digits can also be decoded from said symbol values by application, for each axis, of an arithmetic function in form of a kernel to multiple symbol values, each application thereby yielding one code sequence digit of the respective axis;
by a processing apparatus:
   performing a resampling transform of the captured partial image to yield an array with one discrete symbol value per entry;
   applying said kernels to the array to extract said code sequence digits of each axis;
   assembling the extracted code sequence digits into a plurality of vectors; and
   decoding the plurality of vectors to determine a value for integer-value alignment of the imaging device to the reference scale for each axis of the plurality of axes.

2. The method of claim 1, wherein the plurality of symbols comprise at least one of halftone dots in 2D, spheres, blocks, and hyperspheres in higher dimensional lattices, and wherein a value for the plurality of discrete symbols is represented by area or volume.

3. The method of claim 1, wherein the position code for each axis is a differentially-coded de Bruijn sequence or a Linear Feedback Shift Register (LFSR) sequence that is self-dual under differential coding.

4. The method of claim 1, wherein the combination function is linear addition, and wherein the step of applying kernels comprises extending calculations to accumulate linear sums over a plurality of symbols wherein the plurality of vectors are maintained in the linear processing domain for subsequent processing.

5. The method of claim 1, wherein a spectral analysis of the captured image is used to extract a plurality of fractional alignment parameters of the imaging device relative to the grid pattern; wherein the method further comprises the steps of:
   using the determined alignment values to resample the captured image into the array with one symbol per entry; and
   extracting a plurality of angular and fractional positions for subsequent concatenation with corresponding integer position alignments based on the decoded vectors.

6. The method of claim 1, further comprising estimating axes of further degrees of freedom between the imaging device and the reference scale according to perspective analysis of the captured image and calibration of mechanical characteristics of the imaging device.

7. The method of claim 1, wherein the resampling uses pixel mapping based on a frequency-domain derived transform with inclusion only of values of valid pixels wherein the kernel of each symbol group is fully represented in the captured image without clipping at the captured image edges.

8. The method of claim 1, wherein static, dynamic, inter-frame and intra-frame information, constraints and heuristics are used to reduce position vector decode complexity and increase reliability.

9. The method of claim 1, wherein the grid pattern is configured such that, when decoded by a processing apparatus, the grid pattern is used to compensate for (a) systematic interpolation errors introduced by pattern-related bias and (b) bias caused by known errors detected in the decode process.

10. A position sensing system comprising an imaging device and processing apparatus, wherein the position sensing system is configured to perform the method steps of:
   capturing, by the imaging device, a partial image of a reference scale;
      wherein the reference scale comprises a plurality of symbols in a grid pattern and each symbol represents a symbol value, and wherein the grid positions of said symbols along a plurality of axes in space are encoded using respective symbol values, wherein the plurality of symbol values each represent a combination of code sequence digits from differentially coded position code sequences along each axis of the plurality of axes, wherein multiple code sequence digits form a codeword of sufficient size to represent a digital position on each of the multiple axes, and wherein said combination is obtained by convolving the code sequence of each axis with a respective kernel based on a separable mathematical kernel to thereby define each symbol value by a respective combination function applied to two or more code sequence digits of each axis, such that said code sequence digits can also be decoded from said symbol values by application, for each axis, of an arithmetic function in form of a kernel to multiple symbol values, each application thereby yielding one code sequence digit of the respective axis;
   by the processing apparatus:
      performing a resampling transform of the captured partial image to yield an array with one discrete symbol value per entry;
      applying said kernels to the array to extract said code sequence digits of each axis;
      assembling the extracted code sequence digits into a plurality of vectors; and
   decoding the plurality of vectors to determine a value for integer-value alignment of the imaging device to the reference scale for each axis of the plurality of axes.

11. The position sensing system of claim 10, wherein the imaging device comprises at least one of an optical camera, electrostatic, micromechanical, X-ray, nuclear magnetic resonance, magnetic sensor or other imaging apparatus.

12. The position sensing system of claim 10 wherein the imaging device further comprises multiple sensors and the reference scale further comprises multiple scales systems configured to resolve a full 6-axis position of the imaging device or the higher dimensionality of a moving or flexing target object relative to the imaging device.

13. The position sensing system of claim 10 wherein (a) the grid pattern is configured to act as both the reference scale and a motor element including at least one of the stator grid of a Sawyer motor, an inch-worm drive, or a motion actuator system or (b) the image device is further configured to act as motion actuator.

14. A position coding apparatus for multi-axis position sensing by an imaging device, the position coding apparatus comprising:
   a reference scale comprising a plurality of symbols in a grid pattern and each symbol represents a symbol value, and wherein the grid positions of said symbols along a plurality of axes in space are encoded using respective symbol values, wherein the plurality of symbol values each represent a combination of code sequence digits from differentially coded position code sequences along each axis of the plurality of axes, wherein multiple code sequence digits form a codeword of sufficient size to represent a digital position on each of the multiple axes, and wherein said combination is obtained by convolving the code sequence of each axis with a respective kernel based on a separable mathematical kernel to thereby define each symbol value by a respective combination function applied to two or more code sequence digits of each axis, such that said code sequence digits can also be decoded from said symbol values by application, for each axis, of an arithmetic function in form of a kernel to multiple symbol values, each application thereby yielding one code sequence digit of the respective axis.

15. The position coding apparatus of claim 14, wherein a modulation is applied that inverts up to half of the code sequence digits to achieve a uniform DC-balanced reference scale.

16. The position coding apparatus of claim 14, wherein the plurality of symbols comprises axis sequences which are selected for the grid pattern such that every codeword used is unique in sequence codeword values of all axes and may be used to unambiguously identify both axis and position when processed by a processing apparatus.

17. The position coding apparatus of claim 16, wherein axis sequences are chosen such that every codeword used and its corresponding bit-reversed value is unique within sequence codeword values of all axes and thus unambiguously identifies axis, position, and quadrant under any rotation or reflection.

18. The position coding apparatus of claim 14, wherein the reference scale further comprises redundant information useable for error detection and correction by including at least one of averaging, majority voting, correlation functions, minimum Hamming distance calculation, maximum likelihood, and concatenated error correction.

19. The position coding apparatus of claim 14, wherein the grid pattern includes an extra or redundant code axis which enables an any-angle, high-aspect-ratio imaging scale pattern decoding.

20. The position coding apparatus of claim 14 wherein the reference scale is formed by shaping, printing, lithography, display, projection, or holography on a planar surface, planar surface with polar coordinate arrangement, curved surface including at least one of cylinder or sphere, and optionally where cyclic codes are used to seamlessly wrap around the scale on one or more axes.

* * * * *